United States Patent
Depetro et al.

[11] Patent Number: 5,852,314
[45] Date of Patent: Dec. 22, 1998

[54] THIN EPITAXY RESURF INTEGRATED CIRCUIT CONTAINING HIGH VOLTAGE P-CHANNEL AND N-CHANNEL DEVICES WITH SOURCE OR DRAIN NOT TIED TO GROUND

[75] Inventors: Riccardo Depetro, Domodossola; Claudio Contiero, Buccinasco; Antonio Andreini, Usmate Velate, all of Italy

[73] Assignee: SGS—Thomson Microelectronics S.r.l., Agrate Brianza, Italy

[21] Appl. No.: 643,152

[22] Filed: Apr. 30, 1996

[30] Foreign Application Priority Data

May 2, 1995 [EP] European Pat. Off. ............. 95830176

[51] Int. Cl.$^6$ ................. H01L 29/76; H01L 29/94; H01L 23/58
[52] U.S. Cl. ................. 257/343; 257/409; 257/492
[58] Field of Search ................. 257/343, 409, 257/369, 492, 493, 339, 341, 342

[56] References Cited

U.S. PATENT DOCUMENTS

| 4,300,150 | 11/1981 | Colak | 257/492 |
| 5,043,788 | 8/1991 | Omoto et al. | 257/369 |

FOREIGN PATENT DOCUMENTS

| 069429A3 | 1/1983 | European Pat. Off. | 257/343 |
| 500233A2 | 8/1992 | European Pat. Off. | 257/369 |

OTHER PUBLICATIONS

Thin Layer High–Voltage Devices (Resurf Devices) by J. A. Appels, et al., Philips J. Res. 35, 1–13, 1980.
IEEE Transactions of Electron Devices, vol. 38, No. 7, Jul. 1991, New York, pp. 1582–1589.
Adriaan W. Ludikhuize, "A Versatile 700–1200–V IC Process for Analog and Switching Applications.".
IEEE Transactions on Electron Devices, vol. 38, No. 8, Aug. 1991, New York, pp. 1935–1942.
Wai Tung Ng et al., "A CMOS–compatible Complementary SINFET HVIC Process," p. 1936/.

*Primary Examiner*—Steven H. Loke
*Attorney, Agent, or Firm*—Allen, Dyer, Doppelt, Milbrath & Gilchrist, P.A.

[57] ABSTRACT

N-channel LDMOS and p-channel MOS devices for high voltage integrated in a BiCMOS integrated circuit and exploiting a RESURF condition are provided with a buried region of the same type of conductivity of the epitaxial layer and a doping level intermediate between the doping level of the epitaxial layer and the doping level of a well region. The devices may be configured as source or drain followers without problems.

6 Claims, 1 Drawing Sheet

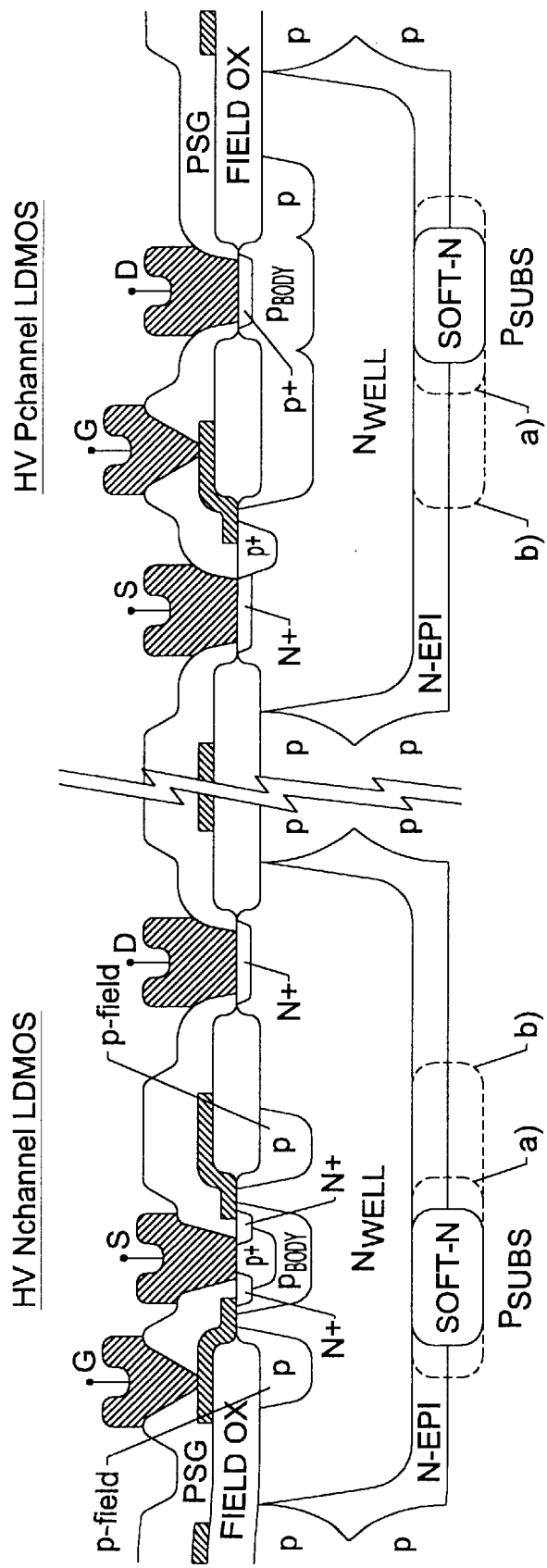

THIN EPITAXY RESURF INTEGRATED CIRCUIT CONTAINING HIGH VOLTAGE P-CHANNEL AND N-CHANNEL DEVICES WITH SOURCE OR DRAIN NOT TIED TO GROUND

CROSS-REFERENCE TO RELATED APPLICATION

This application claims priority from EP 95830176.4, filed May 2, 1995, which is hereby incorporated by reference.

BACKGROUND AND SUMMARY OF THE INVENTION

This invention relates to integrated circuits that use the so-called RESURF condition (REduced SURface Field), whereby power devices can stand relatively high voltages, especially where n-channel lateral double-diffused MOS ("LDMOS") transistors and/or lateral p-channel transistors are to operate with either their source or drain not tied to ground potential. This invention improves breakdown voltage characteristics, allowing the use of these lateral RESURF transistors in a source (drain) follower (in MOS devices, the drain and source are usually symmetrical) configuration even when operating under critical conditions as well as reducing the conduction resistance.

Generally, high voltage ("HV") integrated circuits contain one or more power transistors and a signal processing and control circuitry with a high density of integration and operating at a low voltage on the same chip. The use of this type of integrated circuit, commonly called mixed technology or bipolar and complementary MOS ("BiCMOS") devices, is becoming more frequently considered as an alternative to the use of multiple (discrete) devices in many applications.

A technique for improving the capacity of complementary field-effect power transistors CMOS of the lateral type, for example n-channel LDMOS and p-channel MOS, to stand high voltages is the so-called RESURF technique. This technique is described in an article by J. Appels et al., Vol. 35 (1980), Philips Journal Res., Pages 1–13. This article is herein incorporated by reference.

The RESURF effect is exploited for realizing integrated circuits in a thin epitaxial layer by exerting an accurate control of diffusion implants. This permits the integration of lateral CMOS transistors that can withstand exceptionally high voltages. The RESURF technique presupposes high accuracy in the control of implant doses and permits the realization of HV lateral transistors operating in an epitaxial layer thinner than that normally required for the integration of conventional HV transistors.

Therefore, the bottom of the depletion region, concerning the junction between the epitaxial layer, for example having an n-conductivity type, and the substrate of a p-conductivity, assumes a determinant role on the capacity of RESURF integrated structures, as for example in the case of an n-channel LDMOS transistor normally used as an output power transistor in this type of devices, to withstand high voltages.

The breakdown mechanisms of a RESURF LDMOS structure have been thoroughly investigated in terms of a canonical configuration with the source coupled to ground potential and for different operating conditions: with a drain voltage higher, equal and lower than that of the so-called "pinch-off" voltage.

The U.S. patent application Ser. No. 08/200,396, filed by the present applicant on 23rd Feb., 1994, describes an improved structure of RESURF LDMOS transistors. In this instance, the breakdown voltage is considerably enhanced in favor of a complete depletion of the drift region even when the drain voltage remains lower than the "pinch-off." This is attained by forming an "enrichment" buried layer to locally increase the dopant concentration of the substrate semiconductor beneath the drain region. The pertinent description of this prior patent application is herein incorporated by reference.

It is well known that in those applications where the source of a RESURF LDMOS is not linked to ground potential, that is when implementing partially or completely a source-follower LDMOS stage, the integrated structure presents a high criticality in terms of the "punch-through" phenomenon. Generally, this is because under the body region of a LDMOS there exists a residual net charge between the body and the substrate, that although limited in magnitude is able to determine "punch-through" voltages in the order of 10–60V.

Generally, when unconcerned with the requisite of ensuring RESURF conditions, it is known from the U.S. Pat. No. 4,639,761 to increment the charge below a body region by forming an $n^+$-buried layer through an implant step that is normally contemplated in a BiCMOS mixed process.

The utilization of a n-buried layer under a body region has never been applied nor has it been considered applicable in a RESURF structure (typically requiring a particularly thin epitaxial layer), as this would have promoted a premature breakdown (that is a breakdown near the surface) of the structure.

Contrarily to this consolidated notion, it has now been found and is the subject of this invention, that lateral, field-effect complementary devices destined to operate at high voltages based on exploiting a RESURF condition and therefore integratable within a thin epitaxial layer, can reach extraordinarily high breakdown voltages. This is achieved by forming projectively beneath the body region and adjacently to the well region a layer or buried region of the same type of conductivity as that of the well region and of the epitaxial layer but having in an intermediate concentration of dopant, compared to that of the above stated regions of the same type of conductivity.

In an LDMOS structure, the effectiveness of a buried layer with an intermediate concentration of dopant is enhanced by the presence of a field isolation diffusion. This is commonly located below the edge of the field oxide that defines the source and channel area as described in a previous patent application U.S. Ser. No. 08/403,629, filed on 24th Apr. 1995, Divisional of U.S. Pat. No. 5,430,316 by the applicant, the content of which is herein incorporated by reference.

The invention allows the realization of an LDMOS-RESURF transistor, that can be configured source follower, with the capacity of withstanding voltages in the order of 250V or higher than the maximum voltage bearable by a comparable LDMOS-RESURF structure of the prior art without a buried region having an intermediate doping level.

Similarly, this invention contemplates the presence of a buried region with an intermediate concentration of dopant, located below a relative body region containing a drain region of a complementary MOS structure as referred to that of the n-channel LDMOS structure described above. Even in this complementary structure, the buried region with an intermediate concentration of dopant improves the "punch-through" characteristics between the source/drain and the substrate of the device.

In practical terms, this invention allows the realization of HV MOS devices, for example n-channel LDMOS transistors configurable as source-follower and p-channel MOS transistors that can operate at a high voltage, thus avoiding the need of increasing the thickness of the epitaxial layer. In this way, it is possible to ensure a better compatibility of integration of such high voltage components in the production of BiCMOS devices that are nominally designed for a relatively low supply voltage. All this without compromising the characteristics of density of integration that would be negatively affected by the necessity of increasing the thickness of the epitaxial layer necessary for the power transistors to stand high voltages.

BRIEF DESCRIPTION OF THE DRAWING

The various characteristics of this invention and relative advantages will be even more evident from the following description of some important embodiments and by referring to the FIGURE that shows the cross section made according to this invention.

The FIGURE shows a partial section of an integrated circuit and more specifically that of two complementary field-effect devices commonly used as HV RESURF power devices in mixed technology integrated circuits (BiCMOS). Purely by way of an example, the FIGURE shows the structure of a HV n-channel LDMOS and the structure of a HV p-channel MOS. Both structures are realized in a n-epitaxial layer (N-EPI), of relatively small thickness, grown on a p-substrate (P-SUB) and exploit the RESURF condition so to allow the transistors to function with relatively high voltages.

Naturally, an integrated circuit may contain either an HV N-channel LDMOS or HV P-channel MOS structure or even both, commonly used for output power stages of an integrated circuit that comprise a signal processing and control circuitry. This circuitry may employ bipolar or MOS (CMOS) transistors of high density of integration designed for low supply voltages, according to opportunities offered by BiCMOS processes. In this type of processes the compatibility requirements of structures technologically different from each other are very important.

DETAILED DESCRIPTION OF THE PREFERRED EMBODIMENTS

With reference to the example shown in the FIGURE and according to one fundamental aspect of this invention, in a zone projectively beneath the body region of a n-channel LDMOS structure and that of the complementary p-channel MOS transistor, adjacent to the relative well region (N-Well), an n-type buried layer (SOFT-N) having an intermediate concentration of dopant compared with the dopant concentration of the epitaxial layer (N-EPI) and that of the N-Well region is formed. This buried region (SOFT-N) having a doping level of intermediate value, can be formed by implanting definite areas of the substrate by a dedicated step or by employing the implant conditions already defined for other specific purposes of the process (and to be carried out at different stages of the fabrication process).

The implant area, that is the lateral extension of the buried region SOFT-N can be modulated in function of the electrical behavior of the device required.

As illustrated by way of example by the alternative profiles a) and b) in the FIGURE, the lateral extension of the buried region SOFT-N may be progressively extended (case b) as far as beneath the drain region in the n-channel LDMOS structure, or as far as beneath the source region in the p-channel MOS transistor structure.

Generally, extending the buried region SOFT-N as far as in case b is beneficial in minimizing the conduction resistance (Ron) of the device. However, the lateral extension of the buried region SOFT-N beyond the perimeter delimited by the body region (P-body) of the device, tends to slightly reduce the breakdown voltage compared to the maximum value that would be otherwise obtained.

In practical terms, the effect of increasing the "punch-through" voltage attained by increasing the charge determined by the presence of a buried region SOFT-N is anyhow attained, even when the lateral extension of the buried region SOFT-N is at least equal or slightly wider than the projected area of the body region (P-body).

As shown in the FIGURE, the breakdown voltage in the case of an HV n-channel LDMOS structure is decidedly improved, even by a combined presence of a field isolation diffusion directly under the edge of the field oxide (FIELD OX.) that delimits the source and channel area that, in the illustrated example, is a p-type diffusion (p-field).

Practically, when operating under conditions where the LDMOS transistor source is not tied to ground potential (source follower stage), the structure ability to stand a high voltage is due to a synergic effect between the field isolation diffusion (p-field) and the increment of net residual charge between body and substrate determined by the presence of a buried layer SOFT-N projectively beneath the body region.

Similarly, the breakdown voltage of an HV p-channel MOS transistor structure, as the one illustrated in the FIGURE, can be increased by employing a slightly doped drain region to establish a low electrical field in the drain-body region, as described in the article "A versatile 250/300V IC process for analog and switching applications," A. W. Ludikhuize, IEEE Trans. on Electron. Dev., Vol. ED-33, No. 12, December 1986. This condition can be achieved by exploiting the p-field implant step used for the n-channel LDMOS, as described in the article. The p-type drain extension region is covered by the field oxide (FIELD OX.) and is therefore slightly influenced by external charges (i.e. by parasitic effects). However, a device of these characteristics remains limited in terms of "punch-through" voltage between the source/drain and the substrate.

Even in a RESURF structure of a p-channel MOS transistor, the formation of a SOFT-N region below the N-Well region decisively improves the "punch-through" characteristic.

In the case of an LDMOS structure as well as of a complementary MOS transistor structure, the implant of a buried region SOFT-N with an intermediate concentration of dopant should be carefully calibrated. An excessive implant dose could positively satisfy "punch-through" voltage requisites but, due to a decrease of resistivity, would tend to produce an increased electric field intensity at the semiconductor surface, thus favoring a so-called premature breakdown phenomenon. Contrarily, implanting an excessively low dose would not produce the desired increment of the "punch-through" voltage.

In general, an optimal implant dose for the SOFT-N region allows the breakdown to occur away from the surface of the semiconductor without any substantial injection of carriers in the dielectric and therefore ensuring great reliability of the device during its operating life.

The example shown in the FIGURE relates to a BiCMOS process for 5V, 20V and 200V where the various characteristics are summarized in the following Table.

TABLE

| | | |
|---|---|---|
| P-SUB | thickness ≈ 300 μm | resistivity (bulk) 100–200 Ωcm |
| N-EPI | thickness 5–10 μm | resistivity (bulk) 10–20 Ωcm |
| N-Well | depth ≈ 5 μm | resistivity (square) ≈ 3000 Ω/■ |
| P-body | depth ≈ 2.5 μm | resistivity (square) ≈ 1000 Ω/■ |
| P-field | depth ≈ 2.5 μm | resistivity from 1000 to 10000 Ω/■ |
| SOFT-N | Implant dose from | $5 \times 10^{11}$ to $2 \times 10^{12}$ Atoms/cm$^2$ |

As previously mentioned, the geometric dimensions, that is the lateral extension of the SOFT-N diffusions, and in an the n-channel LDMOS structures, even P-field diffusions, will depend on the electrical performances that are required.

According to a disclosed class of innovative embodiments, there is provided: A BiCMOS integrated circuit formed in a relatively thin epitaxial layer of a first type conductivity, grown on a substrate of a second type of conductivity, containing n-channel (LDMOS) and p-channel MOS devices for high voltages together with bipolar and CMOS devices for signal processing, characterized in that these high voltage devices comprise a buried region of said first type of conductivity projectively beneath at least a body region of the device and having a dopant concentration intermediate between the concentration of said epitaxial layer and the concentration of said well region.

As part of this embodiment, it is further disclosed wherein said buried region extends laterally beyond the projected perimeter of said body region.

As part of this embodiment, it is further disclosed wherein said high voltage n-channel MOS device has a source and a channel area surrounded by a thick field oxide layer, the area defining edge thereof is surmounted by a gate electrode of the device and below said edge there is a diffused region of said second type conductivity.

As part of this embodiment, it is further disclosed wherein the diffusion profile of said diffused region of said second type of conductivity is identical to the diffusion profile used for forming an extended drain and source area in a high voltage MOS device.

As part of this embodiment, it is further disclosed to be characterized in that said diffusion regions of said second type of conductivity are self-aligned to the edge of said field oxide.

As part of this embodiment, it is further disclosed wherein the dopant concentration of said buried region of said first type of conductivity is such as to satisfy the condition of complete depletion in the well region beneath the body region in the high voltage n-channel device and beneath the source and drain regions in the high voltage p-channel device.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

What is claimed is:

1. An integrated circuit, comprising:

a thin epitaxial layer having a first conductivity type, said epitaxial layer being grown on a substrate having a second conductivity type;

n-channel lateral double-diffused insulated gate field-effect-transistor and p-channel insulated gate field-effect-transistor devices for high voltages and bipolar and CMOS devices for signal processing;

wherein each of said lateral double-diffused insulated gate field-effect-transistor and insulated gate field-effect-transistor devices comprise a well region having said first conductivity type, a body region having said second conductivity type, and a buried region having said first conductivity type adjacent to said well region and projectively beneath at least said body region, said buried region having a dopant concentration intermediate between the concentration of said epitaxial layer and the concentration of said well region.

2. The integrated circuit of claim 1, wherein said buried region extends laterally beyond the projected perimeter of said body region.

3. The integrated circuit of claim 1, wherein said n-channel lateral double-diffused insulated gate field-effect-transistor device has a source area and a channel area defined by a thick field oxide layer, and a diffused region having said second type of conductivity located below the edge of said field oxide layer.

4. The integrated circuit of claim 3, wherein the diffusion profile of said diffusion region is identical to the diffusion profile used for forming an extended drain area and a source area in a high voltage MOS device of the integrated circuit.

5. The integrated circuit of claim 3, wherein said diffused region is self-aligned to the edge of said field oxide.

6. The integrated circuit of claim 1, wherein the dopant concentration of said buried region is such as to satisfy the condition of complete depletion in said well region beneath the body region in the n-channel transistor and beneath the source and drain regions in the p-channel transistor.

\* \* \* \* \*